United States Patent
Junger et al.

(10) Patent No.: US 6,661,525 B2
(45) Date of Patent: Dec. 9, 2003

(54) METHOD FOR MONITORING THE LENGTH OF CONSTANT-WIRE-LENGTH BONDS AND APPARATUS THEREFOR

(75) Inventors: Klaus Junger, Allmersbach im Tal (DE); Willibald Konrath, Cottenweiler (DE); Stefan Kern, Waghausel (DE)

(73) Assignee: Marconi Communications GmbH, Backnang (DE)

( * ) Notice: Subject to any disclaimer, the term of this patent is extended or adjusted under 35 U.S.C. 154(b) by 150 days.

(21) Appl. No.: 09/951,274

(22) Filed: Sep. 11, 2001

(65) Prior Publication Data

US 2002/0113978 A1 Aug. 22, 2002

(30) Foreign Application Priority Data

Sep. 11, 2000 (EP) .............................................. 00119756

(51) Int. Cl.$^7$ .......................... G01B 11/06; G01C 1/06; H01L 23/58; H01L 21/50; B32B 31/00
(52) U.S. Cl. ........................ 356/634; 356/142; 356/140; 356/139; 356/397; 356/616; 257/665; 257/673; 257/676; 257/784; 156/64; 156/249; 438/123; 438/124
(58) Field of Search ................................ 356/142, 140, 356/139, 397, 616, 634; 257/665, 673, 676, 784; 156/64, 249; 438/123, 124

(56) References Cited

U.S. PATENT DOCUMENTS 5,384,558 A * 1/1995 Maruhashi
5,395,035 A * 3/1995 Nakao
5,459,284 A * 10/1995 Bockelman et al.
5,889,320 A * 3/1999 Phelps, Jr. et al.
6,153,506 A * 11/2000 Kermani
6,164,522 A * 12/2000 Lautzenhiser et al.
6,414,386 B1 * 7/2002 Beaulieu et al.

FOREIGN PATENT DOCUMENTS

| EP | 0 604 782 A1 | 7/1994 |
|---|---|---|
| JP | 59-84534 | 5/1984 |
| JP | 59-150436 | 8/1984 |
| JP | 61-168235 | 7/1986 |
| JP | 8-114426 | 5/1996 |

* cited by examiner

*Primary Examiner*—Frank G. Font
*Assistant Examiner*—Khaled Brown
(74) *Attorney, Agent, or Firm*—Kirschstein, et al.

(57) ABSTRACT

On a circuit-board intended for constant-wire-length (CWL) bonding, one or more special "test" pairs of bonding pads are provided along with, in each case, a series of markings adjacent the pads. In use, the board is populated with CWL bonds (this includes the normal circuit-related RF bond-pads as well as the test bond-pads) and the test bonds are distorted so that the bond-wires in question lie aligned against the markings. The alignment position relative to the markings indicates whether the bond-wires for the whole board are of correct or incorrect length. Measurement may be either absolute, in which case the markings are associated with a scale indication, or relative, in which case one of the markings will usually be visibly distinguished from the rest in some way. Depending on the length determination, the bond-forming device (e.g., ball and wedge) is adjusted so as to reduce any difference between the indicated length and the desired length when the next board is populated or when the next multi-board production run takes place.

25 Claims, 2 Drawing Sheets

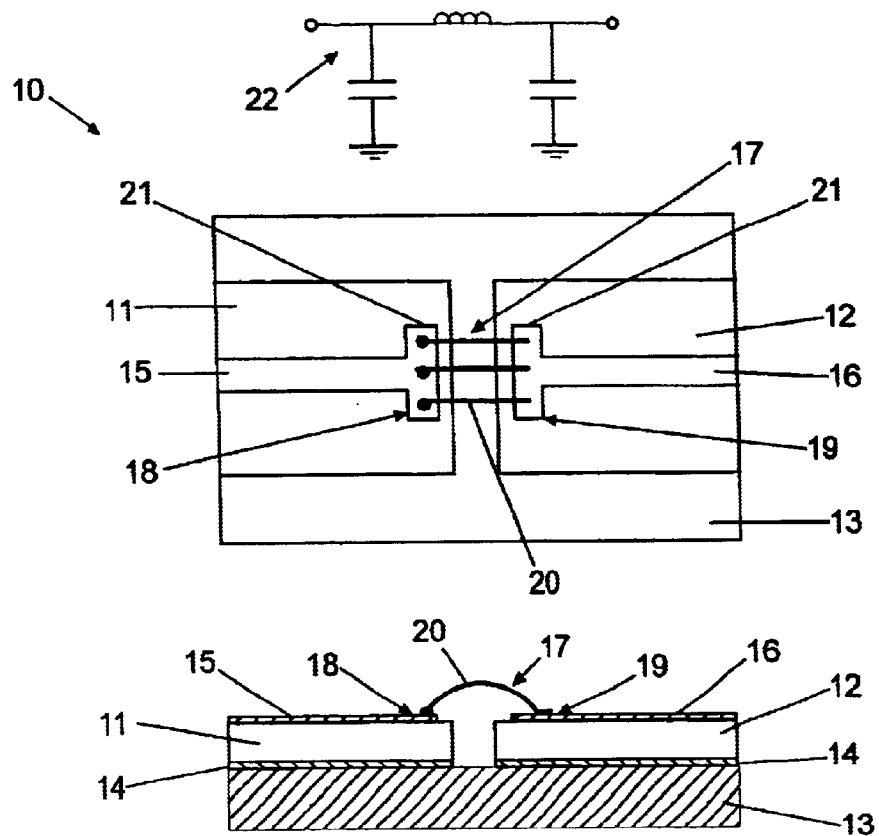
Fig 1 "PRIOR ART"
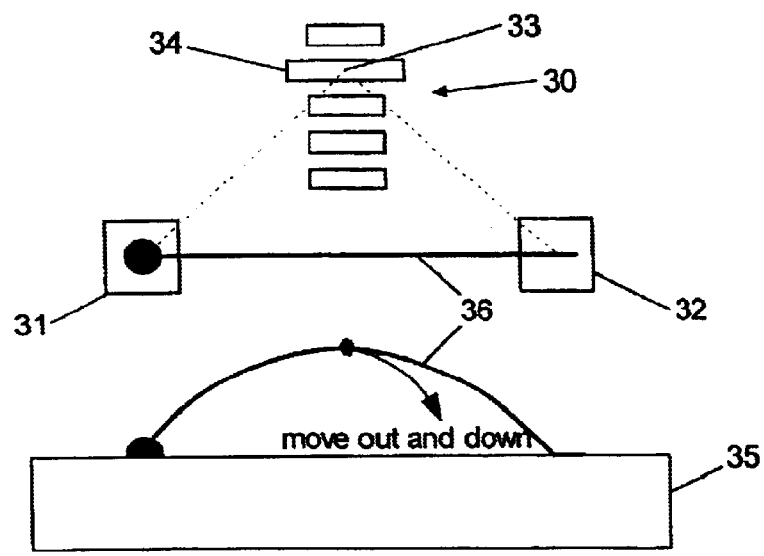
Fig 2

METHOD FOR MONITORING THE LENGTH OF CONSTANT-WIRE-LENGTH BONDS AND APPARATUS THEREFOR

BACKGROUND OF THE INVENTION

The invention relates to a method for monitoring the length of constant-wire-length bonds employed on a circuit board, in particular, but not exclusively, circuit boards for microwave-circuit use.

It is often required in circuit-board construction to interconnect two components (e.g., two thin-film substrates, or a thin-film substrate and an active electronic component, e.g., a MMIC), disposed adjacent to each other on a common carrier. Where the interconnections are intended to carry RF (e.g., microwave) signals, it is important that the interconnections have predictable electrical characteristics (parasitic inductance and capacitance). Unfortunately, interconnection techniques commonly employed at sub-RF frequencies give rise to variable parasitic parameters due to the fact that certain tolerances are involved in the construction of the circuit-board. Thus, for example, the placing of the substrates (or substrate and active component) on the carrier will have an accuracy-tolerance, as will also the disposition of the interconnect bond-pads on the substrates relative to the edges of the respective substrates. Since pad-spacing will vary, the simpler bonding techniques will result in interconnects (bond-wires) of different length between the bond-pads of the two substrates (or of the substrate and active component) and these different lengths will have associated with them different inductances, which is undesirable.

To counteract this, it is known, especially in the microwave field, to employ a constant-wire-length (CWL) bonding system for the bonding together of the components on the carrier. To achieve this, the preferred bonding technique is normally the so-called "ball and wedge" or, alternatively, the "wedge and wedge" bonding method.

Use of a CWL technique especially at microwave frequencies has the beneficial effect of ensuring that the electrical characteristics of all the RF-signal-carrying bonds on the circuit board are substantially the same. A representative CWL bond is shown in FIG. 1. In FIG. 1 a circuit-board arrangement 10 comprises a couple of substrates 11, 12 secured to a housing or carrier 13 by means of an adhesive 14, and a 50-ohm line 15, 16 on each of the substrates. Connecting the two lines are wire-bonds 17 formed by the ball-and-wedge method. Under this method a continuous length of wire is attached at its lower end to a first one of the sites 18 by a gold ball under the application of ultrasonic energy, is looped over to the corresponding one of the sites 19 and is attached, again via ultrasonics, to this site and thereby also to the line 16. The second attachment of this pair of attachments is formed as a wedge shape, hence the name of the process: "ball-and-wedge bonding". The wire loop is then detached from the second bond and the new wire-end used to start the next bonding operation.

The loops 20 are of constant length, not only for the illustrated bonds, but also for every other RF bond on the circuit board. This allows all the RF bonds to have a more or less constant electrical characteristic by virtue of the fact that the constant-length wires are of constant inductance. This inductance in conjunction with the fixed parasitic capacitance associated with the various line pads (the pads are designed to have a substantially equal capacitance characteristic) forms a low-pass L-C filter 22 which affects the signals carried by the lines in a similar and predictable way. The length of the bonds is chosen to accommodate the maximum anticipated inter-pad spacing (taking into account tolerances), which means that those bonds which are associated with less-than-maximum pad spacings will have a marked curve as shown in FIG. 1.

Unfortunately, it has been found difficult in practice to predict the exact length that the various bond-wires will possess during a manufacturing run. While the wires will normally all be of substantially constant length, the exact value of that length will possess a degree of uncertainty due to unavoidable tolerances in the bond-making process. (Such tolerances include those associated with capillary movement and wire-clamping and those associated with that part of the bond-making system which recognizes the bond-pad pattern on the substrates, etc). Consequently, there is a need for a method of monitoring and controlling the constant wire-length such that that length approaches a desired value. Preferably, such a method would achieve this requirement in a non-invasive way as far as the circuit-related bonds, i.e., those bonds which play a part in the relevant electronic circuitry, are concerned.

SUMMARY OF THE INVENTION

According to a first aspect of the invention, there is provided a method for monitoring the length of constant-wire-length (CWL) bonds employed on a circuit-board.

According to a second aspect of the invention, the invention provides a method for controlling the length of constant-wire-length (CWL) bonds employed on a circuit-board.

In a third aspect, the invention provides a method for monitoring the length of a wire-bond employed on a circuit-board.

In a fourth aspect, the invention provides for an arrangement for monitoring the length of one or more CWL wire-bonds employed on a circuit-board.

BRIEF DESCRIPTION OF THE DRAWINGS

Embodiments of the invention will now be described, by way of example only, with reference to the drawings, of which:

FIG. 1 shows a series of bonds carried out under a known CWL bonding method;

FIG. 2 illustrates a first embodiment of an arrangement according to the invention for monitoring bond-wire length;

DETAILED DESCRIPTION OF THE PREFERRED EMBODIMENTS

Figure 3:
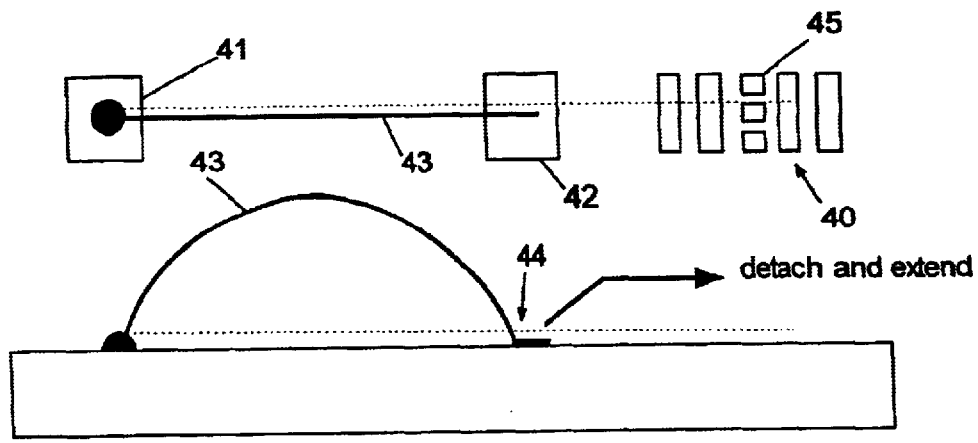
FIG. 3 illustrates a second embodiment of an arrangement according to the invention for monitoring bond-wire length.

Under the present invention one or more special "test-bond" sites are provided at unpopulated locations on the board, preferably on a substrate, and these are supplied with CWL bonds in the same way as the normal CWL bond sites in the remaining areas of the board. Referring to FIG. 2, in a first embodiment of the invention a pair of test-bond pads 31, 32 are disposed a given distance apart on at least one substrate 35 and a number of visible markings 30 is provided in a series one next to the other spaced apart by a given amount along an axis substantially orthogonal to an imaginary line joining the bond-pads 31, 32. The markings can be made by a thin-film deposition process or by laser-etching or by any other convenient method. After the board has been populated with RF bond wires of, as mentioned above, substantially constant length, the actual length of those bonds is tested by taking the center point of the test-bond shown in FIG. 2 and moving it down through an arc of about 90° onto or just above the series of markings 30. Thus the bond-wire will form an approximately triangular shape (see broken line) in conjunction with the aforementioned imaginary line joining the two pads 31, 32. The point where the apex 33 of the triangle meets the series of markings gives an indication of the length of this particular bond and therefore of every other RF bond on the board.

The length indication provided by this process can be either a relative length or an absolute length. In the former case, the position of the apex 33 along the series of markings gives a relative indication of how far the bond length deviates from a desired bond length. In this scenario it is helpful to provide some sort of indication as to which marking corresponds to the "desired" bond length. This can be achieved by arranging for one of the markings to have a distinguishing feature compared with the rest. In the FIG. 2 example the marking 34 is elongated with respect to the other markings, thereby indicating that, in this particular case, the bond length is equal to the desired length. The "elongated" marking may the center marking of the series or may be offset, as illustrated in FIG. 2. Elongation is only one possible way of visibly distinguishing the "desired-length-value" marking from the others. Another method is to form the relevant marking from a series of adjacent spaced-apart marks (see FIG. 3), or the relevant marking may be highlighted by color, for example. These are just three of many conceivable distinguishing measures.

In the case of an absolute measurement-indication, some sort of scale may be supplied adjacent the markings, e.g., the scale may be printed on. In either case, whether relative or absolute, the determination of bond-length by the method of the present invention is reliable by virtue of the fact that the accuracy of the positioning of the test-bond pads and their associated markings is greater than the accuracy of the CWL bond-making process due to the greater tolerances of the latter process.

In a second embodiment of the invention, the markings are placed in a series not along an axis orthogonal to the axis of the substrate(s) or carrier, as in FIG. 2, but along an axis parallel thereto and to one side of the relevant pair of pads. This is illustrated in FIG. 3, in which, as before, two bond-pads 41, 42 are joined by a CWL bond wire 43, but in this case the wire is detached from its bond-pad at one end (the "wedge" end) 44 and pulled out (see broken line) so as to lie essentially flat against the substrate along the series of markings 40, which now lie along the axis joining the two bond-pads. Once again, the length of the wire can be determined by reference to the particular marking against which the end of the wire is aligned. In the illustrated example, the wire is longer than the desired length, the desired length in this case being highlighted by the central marking 45, which in this instance consists of a number of adjacent, spaced-apart sections.

In a variant of this second embodiment (see FIG. 4) the wire is not detached from the substrate, but is merely pushed down in the direction of the markings, as shown. Since in this case the extension of the wire past the relevant bond-pad will not be as great as that which is obtained in the FIG. 3 example, it is necessary to move the series of markings nearer to the bond pad. Although the markings are shown to be adjacent the wedge-end pad 42 in FIG. 4, in practice they may be adjacent the ball-end pad 41 instead.

Figure 4:
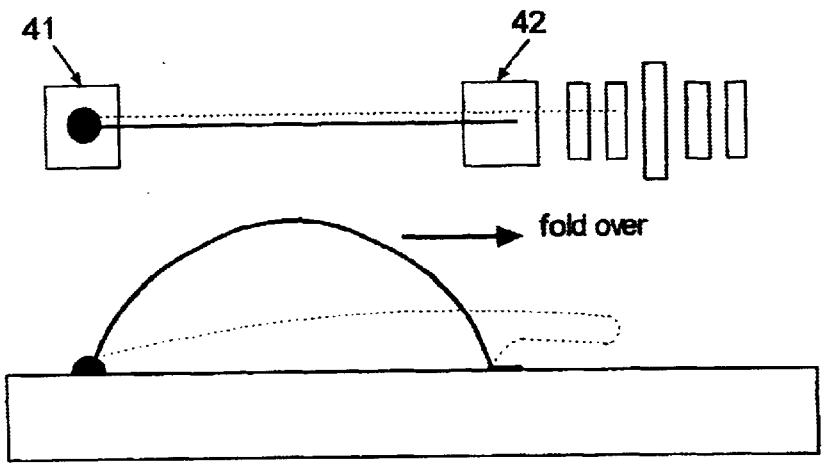
FIG. 4 shows a variant of the second embodiment illustrated in FIG. 3.
Figure 5:
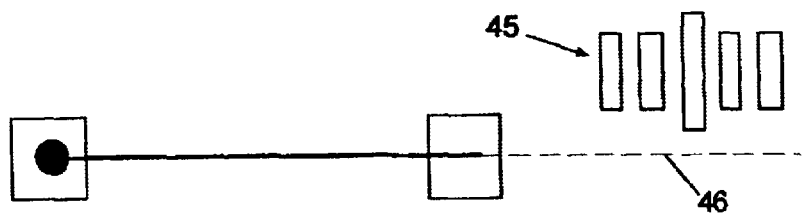
FIG. 5 depicts an alternative placing arrangement for the markings of FIGS. 3 and 4.

Although FIGS. 3 and 4 show the markings to be arranged along an axis which is a continuation of an imaginary line joining the bond-pads, they may alternatively be disposed to one side of such a line, as shown in FIG. 5. The exact placing of the markings will depend mainly on the available space on the circuit board.

It is possible to employ more than one special bond with markings, as described above, on the circuit board. This is particularly useful if it is felt that the bond-forming process is likely to yield variable wire length during the populating of a single board and it is required to monitor the amount of such variability. In this case two or more of the special bonds may be provided at various spaced-out locations on the board and the average relative or absolute wire-length indication taken as the definitive indication for that board. Where, however, the bondwire-length variation between the two (or more) test sites exceeds the stipulated tolerance (a typical figure for length might be 700+/−25 microns), the assumption is made that the CWL bonder needs to be re-adjusted, and this can then be carried out in a manner such as to reduce this variation.

While FIGS. 2 to 5 have shown the markings as being equally spaced apart, they may in contrast be unequally spaced. Furthermore, it may be possible in some circumstances to dispense with a whole series of markings and make use instead of only one marking, corresponding to the elongated one 34 (or broken one 45) shown in the drawings. This is possible where only a relative length indication is required, since the ball-and-wedge settings for successive process runs will simply be adjusted in the correct sense until the special bond-wire aligns with the sole marking. Absolute-length readings will normally require a series of graduated markings, preferably in a linear scale.

The bond-length monitoring method described above assumes that the test-bond pads will be populated with wires at the same time as the RF signal-carrying bond pads will be populated, but an alternative scheme is to secure CWL bonds to the test-sites in a separate process before the normal signal-carrying bonding run is carried out. In this case an initial indication of bond-length is provided which enables the CWL bond-making equipment to be adjusted before time is spent populating the rest of the board with bonds.

The above-described embodiments of the invention result in a method of testing the length of CWL bonds in a non-destructive or non-invasive manner (i.e., the existing "active" or circuit-related bonds are not disturbed in any way), due to the provision of one or more special bond arrangements with markings. As an alternative, special test-bonds may be dispensed with and instead the markings may be provided adjacent existing "active" (i.e., signal-carrying) bonds. In this case bond length will be determined as before, but possibly at the expense of the integrity of a bond which forms part of the circuit on the board. Thus, it might be possible to employ either of the FIG. 2 and FIG. 4 techniques with such signal-carrying bonds, i.e., the bonds may simply be bent to align with the markings, but it would be very difficult afterwards to restore the bond to its original state. Use of the "detach and extend" technique shown in FIG. 3 is considered to be impracticable, since it would be virtually impossible to adequately remake the broken-off connection following the measurement.

We claim:

1. Method of monitoring a length of constant-wire-length (CWL) bonds employed on a circuit-board, comprising the steps of:

(a) providing on the circuit-board in addition to circuit-related bond-pads a test arrangement comprising a pair of test bond-pads and associated, adjacently disposed visual monitoring means;

(b) securing between the pair of test bond-pads a test wire-bond of a length corresponding substantially to the length of the CWL bonds to be secured to the circuit-related bond-pads;

(c) distorting the test wire-bond such as to align it with the visual monitoring means; and (d) assessing from this alignment an actual value of the CWL-bond length.

2. Method as claimed in claim 1, wherein the test wire-bond is secured during the same production-run as that in which the circuit-related wire-bonds are secured.

3. Method as claimed in claim 1, wherein the visual monitoring means are provided as a plurality of spaced-apart markings.

4. Method as claimed in claim 3, wherein the markings are arranged spaced apart along an axis perpendicular to a line joining the pair of test bond-pads and to one side of said line.

5. Method as claimed in claim 4, wherein the axis bisects said line.

6. Method as claimed in claim 5, wherein the test wire-bond is curved and is distorted by being pushed at an approximately central point along its length down toward the markings, such as to create an approximate triangular configuration of the test wire-bond and said line.

7. Method as claimed in claim 3, wherein the markings are arranged spaced apart along an axis which is a continuation of a line joining said pair of test bond-pads.

8. Method as claimed in claim 7, wherein the test wire-bond is curved and is distorted by being pressed substantially flat towards the circuit-board such that part of the test wire-bond moves toward the markings.

9. Method as claimed in claim 8, wherein the test wire-bond is distorted by being detached at one end from the relevant test bond-pad and the free end moved toward the markings until the test wire-bond lies substantially flat over the markings.

10. Method as claimed in claim 1, wherein the assessment of the actual length-value is an assessment of a relative length of the wire-bonds.

11. Method as claimed in claim 10, wherein the visual monitoring means are provided as markings, and wherein the relative length is assessed by reference to a visibly distinguished one of the visual markings.

12. Method as claimed in claim 1, wherein the assessment of the actual length-value is an assessment of an absolute length of the wire bonds.

13. Method as claimed in claim 12, wherein the visual monitoring means are provided as markings, and wherein the absolute length is assessed by reference to an absolute-length scale associated with the visual markings.

14. Method of controlling the length of constant-wire-length (CWL) bonds employed on a circuit-board, comprising the steps of:

(a) providing on the circuit-board in addition to circuit-related bond-pads a test arrangement comprising a pair of test bond-pads and associated, adjacently disposed visual monitoring means;

(b) securing between the pair of test bond-pads a test wire-bond of a length corresponding substantially to the length of the CWL bonds to be secured to the circuit-related bond-pads;

(c) distorting the test wire-bond such as to align it with the visual monitoring means;

(d) assessing from this alignment an actual value of the CWL-bond length;

(e) comparing said actual length-value with a desired length-value; and (f) adjusting a wire-bond forming device employed to provide said circuit-related wire-bonds and said test wire-bond such as to reduce a difference between said actual length-value and said desired length-value.

15. Method as claimed in claim 14, wherein two or more of said test arrangements are provided and, where the actual length-values associated with respective said test arrangements differ from each other by more than a predetermined amount, the wire-bond forming device is adjusted such as to reduce the difference between said actual length-values.

16. Method of monitoring the length of a wire-bond employed on a circuit-board, comprising the steps of:

(a) providing on the circuit-board at least one or more pairs of bond-pads and associated adjacently disposed visual monitoring means;

(b) securing a wire-bond between at least one of said pairs of bond-pads;

(c) distorting the wire-bond such as to align it with the relevant visual monitoring means; and (d) assessing from this alignment a length-value of the wire-bond.

17. Arrangement for monitoring a length of one or more constant-wire-length (CWL) wire-bonds employed on a circuit-board, comprising: one or more pairs of bond-pads disposed on the circuit-board, for receipt of respective wire bonds and, disposed adjacent to at least one of said one or more pairs of bond-pads, a visual monitoring means for assessing a length-value of the wire-bonds.

18. Arrangement as claimed in claim 17, wherein the visual monitoring means comprises a plurality of spaced-apart markings.

19. Arrangement as claimed in claim 18, wherein the markings are spaced apart along an axis perpendicular to an imaginary line joining said pair of bond-pads and to one side of said line.

20. Arrangement as claimed in claim 18, wherein the markings are spaced apart along an axis which is a continuation of a line joining said pair of bond-pads.

21. Arrangement as claimed in claim 18, wherein one of said markings is visibly distinguished from the others.

22. Arrangement as claimed in claim 18, and further comprising an absolute-length scale associated with the markings.

23. Arrangement as claimed in claim 18, wherein the markings are laser markings.

24. Arrangement as claimed in claim 18, wherein the markings are metallization structures.

25. Arrangement as claimed in claim 24, wherein the markings are thin-film structures.

* * * * *